(12) United States Patent
Graessner et al.

(10) Patent No.: US 9,732,745 B2
(45) Date of Patent: Aug. 15, 2017

(54) METHOD FOR OPERATING AT LEAST ONE PUMP FACILITY

(71) Applicants: Joachim Graessner, Boenningstedt (DE); Peter Tietgens, Hamburg (DE)

(72) Inventors: Joachim Graessner, Boenningstedt (DE); Peter Tietgens, Hamburg (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 1345 days.

(21) Appl. No.: 13/648,377

(22) Filed: Oct. 10, 2012

(65) Prior Publication Data

US 2013/0089435 A1 Apr. 11, 2013

(30) Foreign Application Priority Data

Oct. 10, 2011 (DE) .................. 10 2011 084 203

(51) Int. Cl.
*F04B 49/00* (2006.01)
*F04B 49/06* (2006.01)
*G01R 33/38* (2006.01)

(52) U.S. Cl.
CPC ........ *F04B 49/065* (2013.01); *G01R 33/3804* (2013.01)

(58) Field of Classification Search
CPC .............. F04B 49/065; G01R 33/3804; G01R 33/3856; G01R 33/546; G01R 33/543; F25B 2400/17; F25B 9/10; F25D 19/00; H01F 6/04
See application file for complete search history.

(56) References Cited

U.S. PATENT DOCUMENTS

| 2002/0148604 | A1 | 10/2002 | Emeric et al. | |
| 2005/0035764 | A1* | 2/2005 | Mantone | G01R 33/3856 324/318 |
| 2006/0066309 | A1 | 3/2006 | Arik et al. | |
| 2009/0096452 | A1* | 4/2009 | Gore | F25B 49/022 324/318 |
| 2010/0085053 | A1* | 4/2010 | Iwasa | G01R 33/3804 324/318 |
| 2010/0271028 | A1* | 10/2010 | Kawamoto | G01R 33/3873 324/318 |
| 2010/0315086 | A1* | 12/2010 | Sakakura | H01F 6/04 324/318 |
| 2012/0194190 | A1* | 8/2012 | Goto | G01R 33/4833 324/309 |

FOREIGN PATENT DOCUMENTS

| CN | 1326552 A | 12/2001 |
| CN | 1623504 A | 6/2005 |

(Continued)

*Primary Examiner* — Melissa Koval
*Assistant Examiner* — Rishi Patel

(57) ABSTRACT

A method for operating at least one pump facility is proposed. The pump facility is assigned to a cooling facility arranged externally relative to a magnetic resonance facility for examination of an examination object. At least one operating parameter of the pump facility influencing the power input of the pump facility is set as a function of at least one item of control information relating to the examination object to be examined with the magnetic resonance facility.

11 Claims, 1 Drawing Sheet

(56) References Cited

FOREIGN PATENT DOCUMENTS

| | | |
|---|---|---|
| CN | 201107673 Y | 8/2008 |
| CN | 101435855 A | 5/2009 |
| CN | 101498537 A | 8/2009 |
| DE | 10215994 A1 | 10/2002 |
| JP | 2011010760 A | 1/2011 |

\* cited by examiner

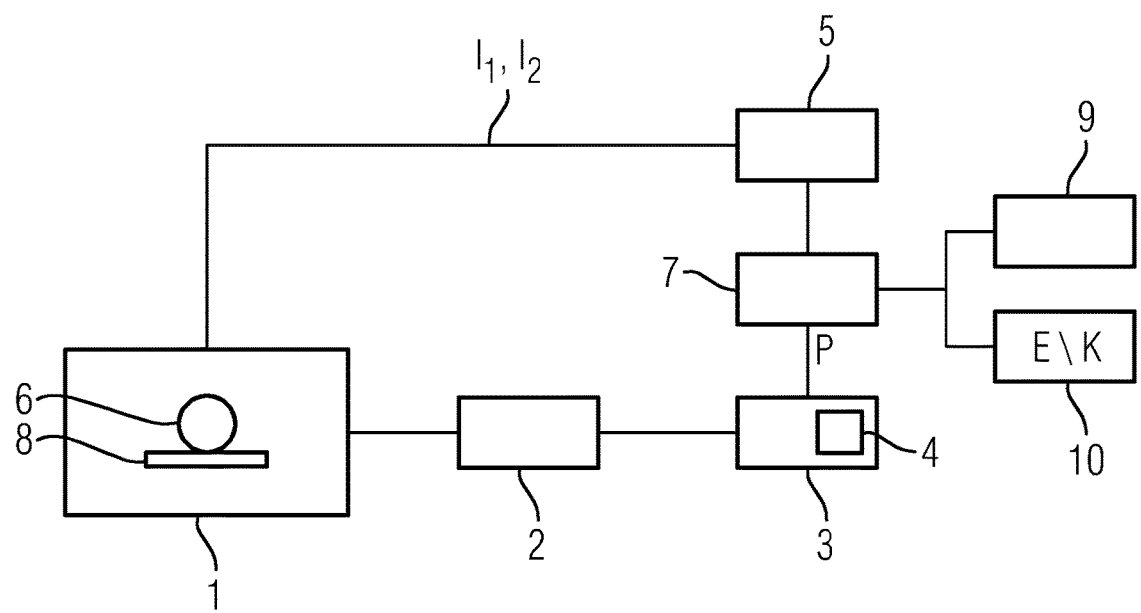

METHOD FOR OPERATING AT LEAST ONE PUMP FACILITY

CROSS REFERENCE TO RELATED APPLICATIONS

This application claims priority of German application No. 10 2011 084 203.9 filed Oct. 10, 2011, which is incorporated by reference herein in its entirety.

FIELD OF INVENTION

The application relates to a method for operating at least one pump facility, which is assigned to a cooling facility arranged externally with respect to a magnetic resonance facility for the examination of an examination object.

BACKGROUND OF INVENTION

Cooling facilities arranged externally with respect to or cooling facilities arranged outside of a magnetic resonance facility in the form of or encompassing corresponding cooling circuits are furthermore known and are used to cool the magnetic resonance facility during operation. Corresponding cooling facilities usually include at least one pump facility, which is used to deliver a coolant flowing through the cooling facility.

Here operation of corresponding pump facilities is in most instances regulated such that the pump facilities are always operated at full load, i.e. with their maximum power input. Consequently, the operation of a pump facility is based on the assumption of the need to provide a maximum cooling output.

It is known to reduce the power input of corresponding pump facilities at specific times, i.e. for instance at night, but this measure often also results in operation of a pump facility based on an excessive assumption of a power input, which leads to an excessively high and/or unnecessary energy consumption and accordingly high operating costs.

SUMMARY OF INVENTION

The object underlying the application is to specify an efficient operating method, in respect of the energy consumption, for a corresponding pump facility.

In order to achieve this object, with a method of the type cited in the introduction, provision is made in accordance with the application for at least one operating parameter of the pump facility influencing the power input of the pump facility to be set as a function of at least one item of control information relating to at least one examination object to be examined with the magnetic resonance facility.

The disclosed method provides to regulate the power input of a corresponding pump facility as a function of at least one item of control information relating to at least one examination object to be examined with the magnetic resonance facility. Accordingly, on the basis of the at least one item of control information relating to at least one examination object to be examined with the magnetic resonance facility, at least one operating parameter of the pump facility influencing the power input of the pump facility is set.

Operation of the pump facility, i.e. the setting of the at least one operating parameter of the pump facility influencing the power input of the pump facility is regulated here such that operation of the pump facility is adjusted efficiently, i.e., to the respective operation of the magnetic resonance facility, which results from the said control information or can at least be estimated therefrom.

During regulation of the power input of the pump facility, i.e. the setting of the at least one operating parameter influencing the power input of the pump facility, the aim is to achieve as minimal a power input as possible, i.e. as minimal an energy consumption of the pump facility as possible. Consequently, setting the at least one operating parameter influencing the power input of the pump facility is to be regarded as optimizing the power input of the pump facility in respect of the current operation of the magnetic resonance facility and the cooling output to be provided herefor by the cooling facility arranged and assigned externally relative hereto. In specific terms, this means that with the high required cooling outputs or cooling outputs to be provided for the magnetic resonance facility, the pump facility is operated with a correspondingly high power input. With low required cooling outputs or cooling outputs to be provided for the magnetic resonance facility, the pump facility is operated with a correspondingly low power input.

Naturally the setting of the power input of the pump facility and/or the setting of the at least one operating parameter influencing the power input of the pump facility does not take place such that the cooling facility including the pump facility provides an excessively low cooling output for the magnetic resonance facility, thereby preventing negative effects on the operation of the magnetic resonance facility.

Provision may expediently be made in this respect for the pump facility always to be operated with a predetermined or predeterminable minimal power input. The minimal power input may be preset for instance as a function of the type of magnetic resonance facility, which regularly contains an item of information relating to its minimal cooling requirement. Similarly, the minimal power input of the pump facility can be predeterminable and changeable by the operator.

In general, the disclosed method enables the operation of the pump facility with respect to its power input to be adjusted depending on the situation and/or individually to the current cooling output required for the correct and reliable operation of the magnetic resonance facility. An energy-efficient operation of the pump facility is possible in this way, thereby reducing the operating costs of the pump facility. This is justified not solely by the actually low energy consumption, but at the same time also by way of a possibly lower strain on components of the pump facility which are liable to wear, which, by virtue of the disclosed method, do not have to be regularly operated continuously at wear-intensive full load.

Expediently, the at least one operating parameter of the pump facility influencing the power input of the pump facility can also be set as a function of at least one item of control information relating to at least one operating parameter of the magnetic resonance facility.

An item of registration information of an examination object and/or an item of position and/or orientation information of a mounting facility supporting the examination object and/or information relating to a measuring protocol set within the scope of operation of the magnetic resonance facility for examining an examination object and/or information relating to a measuring sequence set within the scope of operation of the magnetic resonance facility for examination of an examination object, can be expediently used as an item of control information relating to an operating parameter of the magnetic resonance facility. The list is not exclusive. Any item of information indirectly or directly specifying a cooling output required for operation of the magnetic resonance facility can basically be understood to be an item of control information relating to an operating parameter of the magnetic resonance facility.

An item of dimensional information relating to the dimensions of the examination object and/or an item of examination area information specifying the size of an examination area of an examination object can be used for instance as an item of control information relating to an examination object to be examined with the magnetic resonance facility. This list is also not exclusive. Any item of information indirectly or directly specifying a cooling output required for operation of the magnetic resonance facility and referring back to the examination object can basically be understood to be an item of control information relating to an examination object to be examined with the magnetic resonance facility.

The flow rate of a coolant conveyed by the pump facility and/or the flow speed of a coolant conveyed by the pump facility can be used for instance as an operating parameter influencing the power input of the pump facility. The list is also not exclusive. Any operating parameter of the pump facility, which may have an indirect or direct influence on its power input, such as reduce its power input, can basically be understood to be an operating parameter influencing the power input of the pump facility.

The speed of a motor-driven conveying device associated with the pump facility can be used as operating parameters of the pump facility used to set the flow rate of the coolant conveyed through the pump facility and/or the flow speed of the coolant conveyed by the pump facility. This embodiment of the disclosed method naturally relates to the use of pump facilities with a motor-driven conveying device which can be changed in terms of its speed, such as for instance rotary pumps or suchlike, using a controller. With corresponding pump facilities, the speed achieved by the motor-driven conveying device associated herewith represents a measure of the power input required hereby for operation.

In a further embodiment of the disclosed method, provision is made for an item of information relating to the actual power input of the pump facility and/or an item of information relating to the ratio of the actual power input of the pump facility to its maximum power input to be output to an output device. In this regard, the actual power input of the pump facility can be identified quickly and easily for an operator. The same applies to the ratio of the actual power input of the pump facility to its maximum power input. In both instances, corresponding information relating to graphical elements which can be shown on the output device can be mapped, in this instance meaning for example a monitor or suchlike. A colored design of the graphical elements is also possible, which generally makes it easier to identify and/or evaluate the respective operating state of the pump facility and/or the power input associated therewith. Provision can herewith be made in the case of operating modes of the pump facility consuming little energy for a first colored design, e.g. green, with corresponding graphic elements and in the case of operating modes of the pump facility consuming large amounts of energy, for a second colored design, e.g. red, with corresponding graphic elements.

It is further possible to select a characteristic diagram stored in a storage device and relating to a specific power input of the pump facility as a function of at least one currently existing item of control information of the magnetic resonance facility and to take this into account when setting the operating parameter influencing the power input of the pump facility. Consequently, in this embodiment, not just one operating parameter of the pump facility influencing the power input is set as a function of a corresponding item of control information mapping the current operation of the magnetic resonance facility, but instead a characteristic diagram, which generally contains a host of corresponding operating parameters influencing the power input of the pump facility, and forming the basis of the control of operation of the pump facility.

Characteristic diagrams contain a, for instance tabular, assignment of control information to the power input of the operating parameters influencing the pump facility. Accordingly, a specific item of control information can be assigned to at least one specific operating parameter influencing the power input of the pump facility in a characteristic diagram.

The assignment of control information to corresponding operating parameters influencing the power input of the pump facility takes place by suitable optimization methods and mathematical assignment algorithms used therein, which enable operating parameters influencing the power input of the pump facility to be suitably determined from given items of control information.

It is also expediently conceivable for settings of the operating parameters influencing the power input of the pump facility to be stored in a storage device as setting information, wherein the setting information is taken into account with a current or future setting of corresponding operating parameters influencing the power input of the pump facility. Accordingly, in this embodiment, historic operating parameters already used within the scope of the disclosed method and influencing the power input of the pump facility exist in a storage device and can be selected with operating modes of the magnetic resonance facility which are similarly stored at present or in the future and form the basis of the control of the operating of the pump facility. It is thus possible to dispense with or restrict the determination of corresponding operating parameters influencing the power input of the pump facility, since it is possible to revert back to the operating parameters used already in operating modes of the magnetic resonance facility which are stored in a similar or identical fashion and which influence the power input of the pump facility.

In addition, the application relates to a pump facility of a cooling facility arranged externally relative to a magnetic resonance facility, including device for determining at least one item of control information relating to an examination object to be examined with the magnetic resonance facility, as well as a control facility for setting at least one operating parameter of the pump facility influencing the power input of the pump facility as a function of the at least one item of control information relating to at least one examination object to be examined with the magnetic resonance facility.

In addition to determining at least one item of control information relating to at least one operating parameter of the magnetic resonance and to setting the at least one operating parameter of the pump facility influencing the power input of the pump facility, the device and the control facility are embodied expediently as a function of the at least one item of control information relating at least one operating parameter of the magnetic resonance facility.

The above embodiments of the disclosed method apply similarly to the disclosed pump facility.

BRIEF DESCRIPTION OF THE DRAWINGS

Details of the present application will emerge from the embodiments described below and with the aid of the drawings. In this way the sole FIGURE indicates a basic schematic of a magnetic resonance facility, which is assigned a cooling facility arranged externally relative to the magnetic resonance facility, including a disclosed pump facility.

DETAILED DESCRIPTION OF INVENTION

The FIGURE shows a basic schematic of a magnetic resonance facility 1, which is assigned a cooling facility 2 arranged externally relative to the magnetic resonance facility 1, including a disclosed pump facility 3. The cooling facility 2 is understood to be a cooling circuit arranged externally relative to the magnetic resonance facility 1, which is thermally coupled to the magnetic resonance facility 1. In addition to the externally arranged cooling facility 2, the magnetic resonance facility 1 may also include at least one internal cooling facility and/or at least one internal cooling circuit, which is not shown here however. The term "external" applies to the spatially physical separation between the magnetic resonance facility 1 and the cooling facility 2.

The pump facility 3, which is embodied for instance as a rotary pump and in this regard comprises a motor-driven conveying device 4, such as a motor, for the coolant to be conveyed thereby, such as for instance cooling water, is also assigned a device 5 for determining at least one item of control information I1 relating to at least one operating parameter of the magnetic resonance facility 1 and/or at least one item of control information I2 relating to at least one examination object 6 to be examined with the magnetic resonance facility 1. The device 5 naturally communicates with the magnetic resonance facility 1 by way of a suitable communication and/or data link.

Furthermore, the pump facility 3 comprises a control facility 7 for setting at least one operating parameter P influencing the power input of the pump facility 3 as a function of the at least one item of control information I1 relating to at least one operating parameter of the magnetic resonance facility 1 and/or the at least one item of control information I2 relating to at least one examination object 6 to be examined with the magnetic resonance facility 1. The control facility 7 communicates with the device 5 and the pump facility 3 by way of suitable communication and/or data links.

Within the scope of the disclosed method which relates to the operation of the pump facility 3, provision is made to set at least one operating parameter P of the pump facility 3 influencing the power input of the pump facility 3 as a function of the item of control information I1, I2. The operating parameter P is set as a function of the current operating mode of the magnetic resonance facility 1, which is mapped by the at least one item of control information I1 relating to at least one operating parameter of the magnetic resonance facility 1. In addition or alternatively, the operating parameter P is set as a function of properties of the examination object 6, which are mapped by the at least one item of control information I2 relating to at least one examination object 6 to be examined with the magnetic resonance facility 1.

Upon implementation of the disclosed method, as energy efficient an operation of the pump facility 3 as possible is aimed for, so that corresponding settings of operating parameter P relating to the power input of the pump facility 3 take place such that the power input of the pump facility 3 is as minimal as possible.

The power input of the pump facility 3 is naturally controlled by not setting the at least one operating parameter P influencing its power input, so that correct and reliable operation of the magnetic resonance facility 1 is no longer ensured. This is consequently regarded as highest priority within the scope of the disclosed method. It is expedient to always operate the pump facility 3 with a predetermined or predeterminable minimal power input, so that a minimum amount of cooling power is always made available to the magnetic resonance facility 1 by way of the cooling facility 2.

An item of registration information of the examination object 6 and/or an item of position and/or orientation information of a mounting facility 8 supporting the examination object 6 and/or information relating to a measuring protocol set within the scope of operation of the magnetic resonance facility 1 for examining an examination object and/or information relating to a measuring sequence set within the scope of operation of the magnetic resonance facility for examination of an examination object, can be used as an item of control information relating to an operating parameter of the magnetic resonance facility 1.

An item of dimensional information relating to the dimensions of the examination object 6 and/or an item of examination area information relating to the size of an examination area of the examination object 6 can be used for instance as an item of control information I2 relating to an examination object 6 to be examined with the magnetic resonance facility 1.

Hence, measuring sequences requiring high cooling outputs, such as for instance so-called Echo-planar-imaging, (EPI), measuring sequences can be mapped via the control information I1 for instance, whereupon the control facility 7 sets corresponding operating parameters P of the pump facility 3 in respect of a cooling output to be provided correspondingly high by the cooling facility 2 to the magnetic resonance facility 1.

The same applies for instance to different sizes of examination areas of the examination object 6 to be examined with the magnetic resonance facility 1. The cooling output required for the examination of a knee of the examination object 6 with the magnetic resonance facility 1 may differ for instance from the cooling output required for the examination of the abdomen of the examination object 6 with the magnetic resonance facility 1. Consequently, with the aid of a corresponding item of examination area information, conclusions can be drawn as to a cooling output to be provided for an examination of a corresponding examination area of the examination object 6 by the cooling facility 2 to the magnetic resonance facility 1. Accordingly, operation of the pump facility 3 and its power input is regulated by setting at least one operating parameter P influencing the power input of the pump facility 3.

The flow rate of the coolant conveyed by the pump facility 3 and/or the flow speed of the coolant conveyed by the pump facility 3 is regarded as a corresponding operating parameter P of the pump facility 3 which influences the power input of the pump facility 3 for instance.

The speed of the motor-driven conveying device 4 associated with the pump facility 3 can be used here as operating parameters P influencing the power input of the pump facility 3 in order to set the flow rate of the coolant conveyed through the pump facility 3 and/or the flow speed of the coolant conveyed by the pump facility.

The control facility 7 is further connected to an output device 9 in the form of a screen, which output device 9 may if necessary also form part of the magnetic resonance facility 1. It is thus possible to output an item of information relating to the actual power input of the pump facility 3 and/or an item of information relating to the ratio of the actual power input of the pump facility 3 to its maximum power input to the output device 9.

The graphical representation of corresponding items of information can take place by way of all kinds of different graphical elements, which are understood here for instance to mean corresponding bar charts or suchlike. The graphical display of different items of information relating to the actual power input of the pump facility 3 can be differentiated using color, so that with low actual power inputs of the pump facility 3 and with high actual power inputs of the pump facility 3, a green and red display in each instance of corresponding graphical elements takes place. The same applies naturally to the display of corresponding ratios of the actual power input of the pump facility 3 with respect to the item of information relating to its maximum power input.

It is further possible within the scope of the disclosed method to select a characteristic diagram K stored in a storage device 10 and relating to a specific power input of the pump facility 3 as a function of at least one currently existing item of control information I1, I2 of the magnetic resonance facility 1 and to take this into account when setting the operating parameter P influencing the power input of the pump facility 3.

Similarly, corresponding settings of the operating parameter P influencing the power input of the pump facility 3 can be stored in the storage device 10 as setting information E. The setting information E can be taken into account with a current or future setting of corresponding operating parameters P influencing the power input of the pump facility 3. Consequently, a separate operating parameter P implemented for instance within the scope of an optimization method of the energy efficiency of the pump facility 3, suited to determination and influencing the power output of the pump facility 3 is not always needed, since, if necessary, i.e. with repeatedly occurring similar or identical operating modes of the magnetic resonance facility 1, historical settings of the operating parameter P influencing the power input of the pump facility 3 can be used in the form of setting information E.

Although the application has been illustrated and described in greater detail using the embodiment, the application is not restricted by the disclosed examples and other variations can be derived therefrom by the person skilled in the art, without departing from the scope of protection of the application.

The invention claimed is:

1. A method for operating a pump facility, comprising:
    assigning the pump facility to a cooling facility arranged externally relative to a magnetic resonance facility for examining an examination object; and
    determining a setting of an operating parameter of the pump facility influencing a power input of the pump facility as a function of a control information relating to the examination object,
    wherein historic settings of the operating parameter influencing the power input of the pump facility are stored in a storage device as setting information,
    wherein a current or future setting of the operating parameter influencing the power input of the pump facility is determined according to the historic settings of the operating parameter with repeatedly operating mode of the magnetic resonance facility, and
    wherein the determination of the current or future setting of the operating parameter influencing the power input of the pump facility is dispensed with or restricted by using a historic setting of the operating parameter stored in the storage device with a similar or identical operating mode.

2. The method as claimed in claim 1, wherein the operating parameter of the pump facility is set additionally as a function of a control information relating to an operating parameter of the magnetic resonance facility.

3. The method as claimed in claim 2, wherein the control information relating to the operating parameter of the magnetic resonance facility comprises: registration information of the examination object, position and/or orientation information of a mounting facility supporting the examination object, information relating to a measuring protocol set within a scope of the operation of the magnetic resonance facility, and information relating to a measuring sequence set within the scope of the operation of the magnetic resonance facility.

4. The method as claimed in claim 1, wherein the control information relating to the examination object comprises dimensional information relating to dimensions of the examination object or information specifying a size of an examination area of the examination object.

5. The method as claimed in claim 1, wherein the operating parameter of the pump facility influencing the power input of the pump facility comprises a flow rate of a coolant conveyed by the pump facility or a flow speed of a coolant conveyed by the pump facility.

6. The method as claimed in claim 5, wherein the flow rate of the coolant conveyed by the pump facility or the flow speed of the coolant conveyed by the pump facility is set by a speed of a motor-driven conveying device associated with the pump facility.

7. The method as claimed in claim 1, wherein the pump facility is operated with a predetermined or predeterminable minimum power input.

8. The method as claimed in claim 1, wherein information relating to an actual power input of the pump facility and/or information relating to a ratio of an actual power input relative to a maximum power input of the pump facility is output to an output device.

9. The method as claimed in claim 1, wherein a characteristic diagram relating to a specific power input of the pump facility stored in a storage device is selected, and wherein the operating parameter influencing the power input of the pump facility is set as a function of a corresponding currently existing control information of the magnetic resonance facility according to the characteristic diagram.

10. A pump facility of a cooling facility arranged externally relative to a magnetic resonance facility, comprising:
    a device for determining a control information relating to an examination object to be examined with the magnetic resonance facility; and
    a control facility for determining a setting of an operating parameter of the pump facility influencing a power input of the pump facility as a function of the control information relating to the examination object,
    wherein historic settings of the operating parameter influencing the power input of the pump facility are stored in a storage device as setting information,
    wherein a current or future setting of the operating parameter influencing the power input of the pump facility is determined according to the historic settings of the operating parameter with repeatedly operating mode of the magnetic resonance facility, and
    wherein the determination of the current or future setting of the operating parameter influencing the power input of the pump facility is dispensed with or restricted by using a historic setting of the operating parameter stored in the storage device with a similar or identical operating mode.

11. The pump facility as claimed in claim 10, wherein the device further determines a control information relating to an operating parameter of the magnetic resonance facility, and wherein the control facility further sets the operating parameter of the pump facility influencing the power input of the pump facility as a function of the control information relating to the operating parameter of the magnetic resonance facility.

\* \* \* \* \*